(12) United States Patent
Kim et al.

(10) Patent No.: US 8,791,577 B2
(45) Date of Patent: Jul. 29, 2014

(54) BIT CELL WITH TRIPLE PATTERNED METAL LAYER STRUCTURES

(75) Inventors: Juhan Kim, Santa Clara, CA (US); Jongwook Kye, Pleasanton, CA (US)

(73) Assignee: Globalfoundries Inc., Grand Cayman (KY)

( * ) Notice: Subject to any disclaimer, the term of this patent is extended or adjusted under 35 U.S.C. 154(b) by 120 days.

(21) Appl. No.: 13/617,952

(22) Filed: Sep. 14, 2012

(65) Prior Publication Data
US 2014/0077384 A1  Mar. 20, 2014

(51) Int. Cl.
*H01L 23/48* (2006.01)
*H01L 29/66* (2006.01)
*H01L 23/52* (2006.01)
*H01L 21/4763* (2006.01)

(52) U.S. Cl.
USPC ........... 257/774; 257/335; 257/341; 257/758; 438/637

(58) Field of Classification Search
USPC .............. 257/368, 774, 335, 341, 758; 430/5; 365/154; 438/637
See application file for complete search history.

(56) References Cited

U.S. PATENT DOCUMENTS 6,737,685 B2   5/2004   Aipperspach et al.
8,076,236 B2  12/2011   Schultz et al.

*Primary Examiner* — Shaun Campbell
*Assistant Examiner* — Dzung Tran
(74) *Attorney, Agent, or Firm* — Ditthavong & Steiner, P.C.

(57) ABSTRACT

An approach for providing bit cells with triple patterned metal layer structures is disclosed. Embodiments include: providing, via a first patterning process of a metal layer, a first structure that is a first one of a word line structure, a ground line structure, a power line structure, and a bit line structure; providing, via a second patterning process of the metal layer, a second structure that is different from the first structure and that is a second one of the word line structure, the ground line structure, the power line structure, and the bit line structure; and providing, via a third patterning process of the metal layer, a third structure that is different from the first structure and the second structure, and that is a third one of the word line structure, the ground line structure line, the power line structure, and the bit line structure.

14 Claims, 8 Drawing Sheets

US 8,791,577 B2

BIT CELL WITH TRIPLE PATTERNED METAL LAYER STRUCTURES

TECHNICAL FIELD

The present disclosure relates to fabrication of miniaturized static random access memory (SRAM) bit cells. The present disclosure is particularly applicable to SRAM bit cells for 20 nanometer (nm) technology nodes and beyond (e.g., 14 nm and other technology nodes).

BACKGROUND

As technology advances, and the dimensions of transistor devices continue to shrink, difficulty increases with respect to maintaining lithographic printability of designs for fabrication of semiconductor devices. For example, a known SRAM bit cell 100 in FIG. 1A includes metal1 landing pads 101 for word lines, metal1 landing pads 103 for ground lines, and metal1 bit line structures 105, and metal2 layer structures 107. In addition, bit cell 100 includes active region contacts 109, metal contacts 111, and vial structures 113 for performing various interconnections associated with the metal1 layer structures 101, 103, and 105, and the metal2 layer structures 107. However, bit cell 100 may be difficult to print on a wafer because metal structures of the same color (or patterning) in bit cell 100 are too close to each other. As shown, for instance, word line landing pads 101 may be too close to ground line landing pads 103, and landing pads 101 and 103 may be too close to bit line structures 105. As such, it may become increasingly difficult to further shrink the design of bit cell 100. Moreover, as illustrated by another known SRAM bit cell 130 in FIG. 19, single patterned metal lines (e.g., metal1 layer structures 131 and 133) occupy significant space. However, if the height of bit cell 130 is reduced (e.g., to decrease the space occupied), the tip-to-tip spacing between metal1 layer structures 133 (where the tip is the short side of the structure), particularly in the same color space, will become too close, negatively affecting lithographic printability of bit cell 130.

A need therefore exists for a miniaturized SRAM bit cell with improved lithographic printability, and enabling methodology.

SUMMARY

An aspect of the present disclosure is a method for implementing a bit cell with triple patterned metal layer structures.

Another aspect of the present disclosure is a device implemented with bit cells having triple patterned metal layer structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing, via a first patterning process of a metal layer, a first structure that is a first one of a word line structure, a ground line structure, a power line structure, and a bit line structure; providing, via a second patterning process of the metal layer, a second structure that is different than the first structure and that is a second one of the word line structure, the ground line structure, the power line structure, and the bit line structure; and providing, via a third patterning process of the metal layer, a third structure that is different than the first structure and the second structure, and that is a third one of the word line structure, the ground line structure line, the power line structure, and the bit line structure.

Aspects of the present disclosure include providing a bit cell having the first structure, the second structure, and the third structure. Additional aspects include: providing, via the first patterning process, the word line structure, the power line structure, or a combination thereof of the bit cell; providing, via the second patterning process, the bit line structure of the bit cell; and providing, via the third patterning process, the ground line structure of the bit cell. Various aspects include providing the bit line structure between the word line structure and the power line structure, between the ground line structure and the power line structure, or a combination thereof. Other aspects include the word line structure, the ground line structure, the power line structure, and the bit line structure being metal1 layer structures.

Certain aspects include providing the first structure, the second structure, the third structure, or a combination thereof to have first edges and second edges that are 0 to 10 percent longer than the first edges. Some aspects include providing the word line structure, the ground line structure, or a combination thereof to have the first edges and the second edges. Other aspects include: providing the bit line structure to be 32 nm to 42 nm away from the power line structure; and providing the word line structure, the ground line structure, or a combination thereof to be 32 nm to 42 nm away from the bit line structure. Further aspects include providing the word line structure to be 32 nm to 42 nm away from the ground line structure.

An additional aspect of the present disclosure is a device including: a word line structure; a ground line structure; a power line structure; and a bit line structure, wherein the word line structure, the ground line structure, the bit line structure, or a combination thereof have first edges and second edges adjacent the first edges and that are 0 to 10 percent longer than the first edges.

Aspects include a device having a bit cell that includes the word line structure, the ground line structure, the power line structure, and the bit line structure. Additional aspects include the word line structure, the ground line structure, or a combination thereof having the first edges and the second edges. Some aspects include the bit line structure being 32 nm to 42 nm away from the power line structure, and the word line structure, the ground line structure, or a combination thereof being 32 nm to 42 nm away from the bit line structure. Certain aspects include the word line structure being 32 nm to 42 nm away from the ground line structure. Other aspects include the word line structure, the ground line structure, the power line structure, and the bit line structure being metal1 layer structures.

Another aspect of the present disclosure includes: providing, via a first patterning process of a metal layer, a first structure that is one of a word line structure, a ground line structure, and a power line structure of a bit cell; providing, via a second patterning process of the metal layer, a bit line structure of the bit cell; and providing, via a third patterning process of the metal layer, a second structure that is different than the first structure and that is one of the word line structure and the ground line structure line.

Additional aspects include providing the bit line structure between the word line structure and the power line structure, between the ground line structure and the power line structure, or a combination thereof. Some aspects include providing the first structure, the second structure, or a combination thereof to have first edges and second edges adjacent the first edges and that are 0 to 10 percent longer than the first edges. Various aspects include providing the word line structure, the ground line structure, or a combination thereof to have the first edges and the second edges. Further aspects include the word line structure, the ground line structure, the power line structure, and the bit line structure being metal1 layer structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of lithographic difficulties attendant upon fabrication of bit cells having single patterned or double patterned metal layer structures. The present disclosure addresses and solves such problems, for instance, by, inter alia, providing a first metal layer structure of a bit cell via a first patterning process of a metal layer; providing a second metal layer structure of the bit cell via a second patterning process of the metal1 layer; and providing a third metal layer structure of the bit cell via a third patterning process of the metal layer.

Figure 1A:
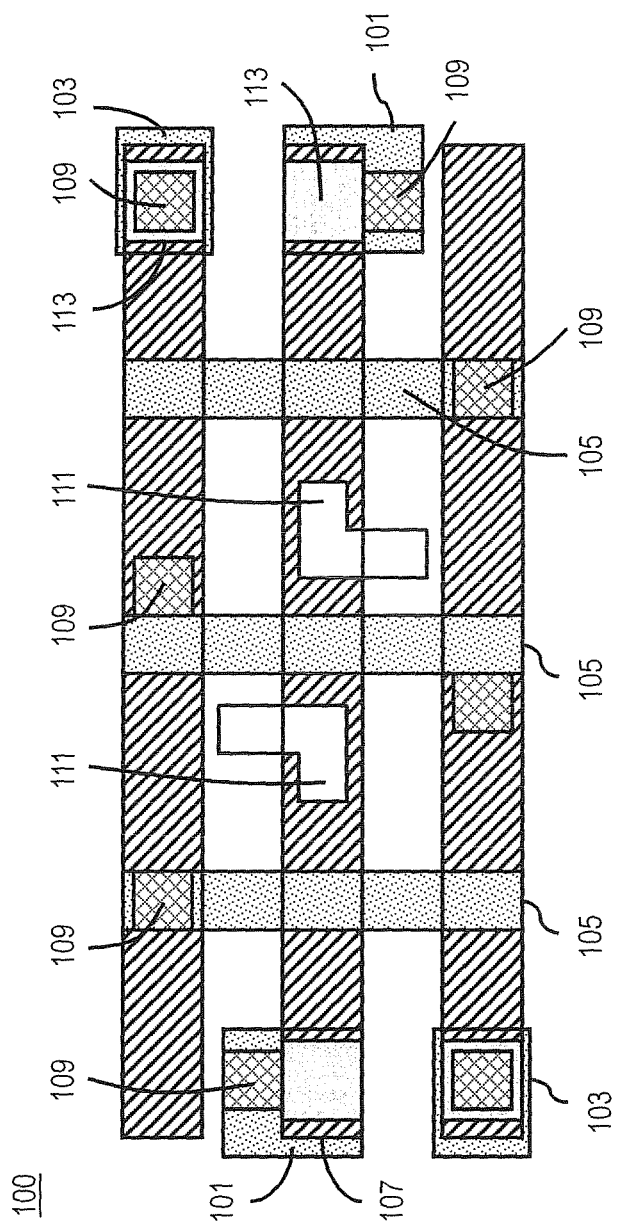
FIGS. 1A and 1B schematically illustrate SRAM bit cells with single patterned metal layer structures.
Figure 1B:
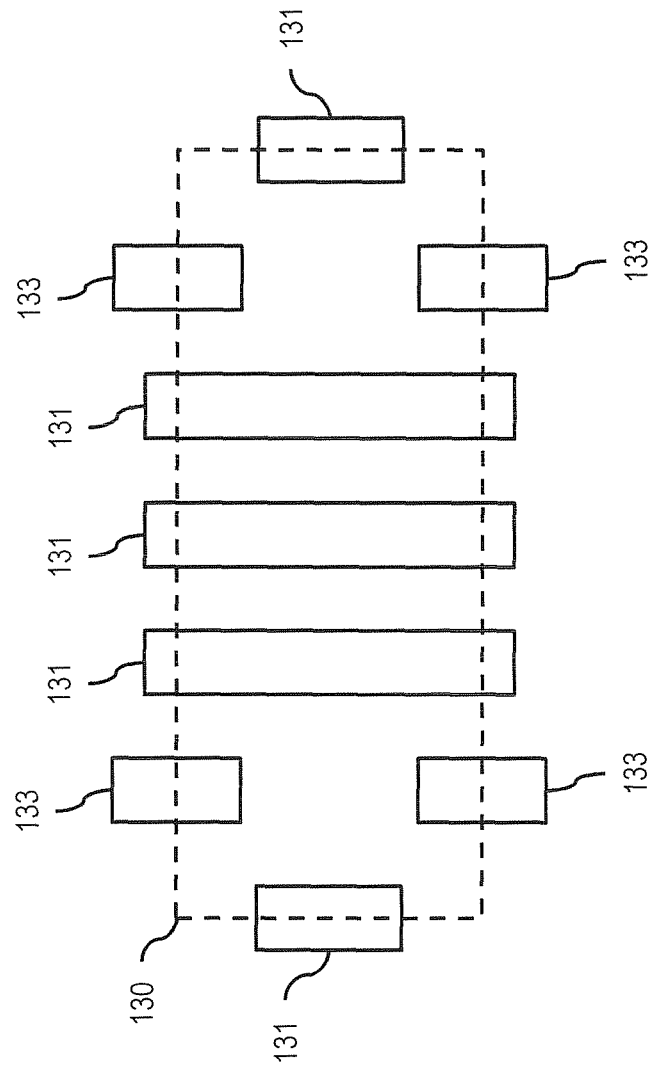
Figure 2:
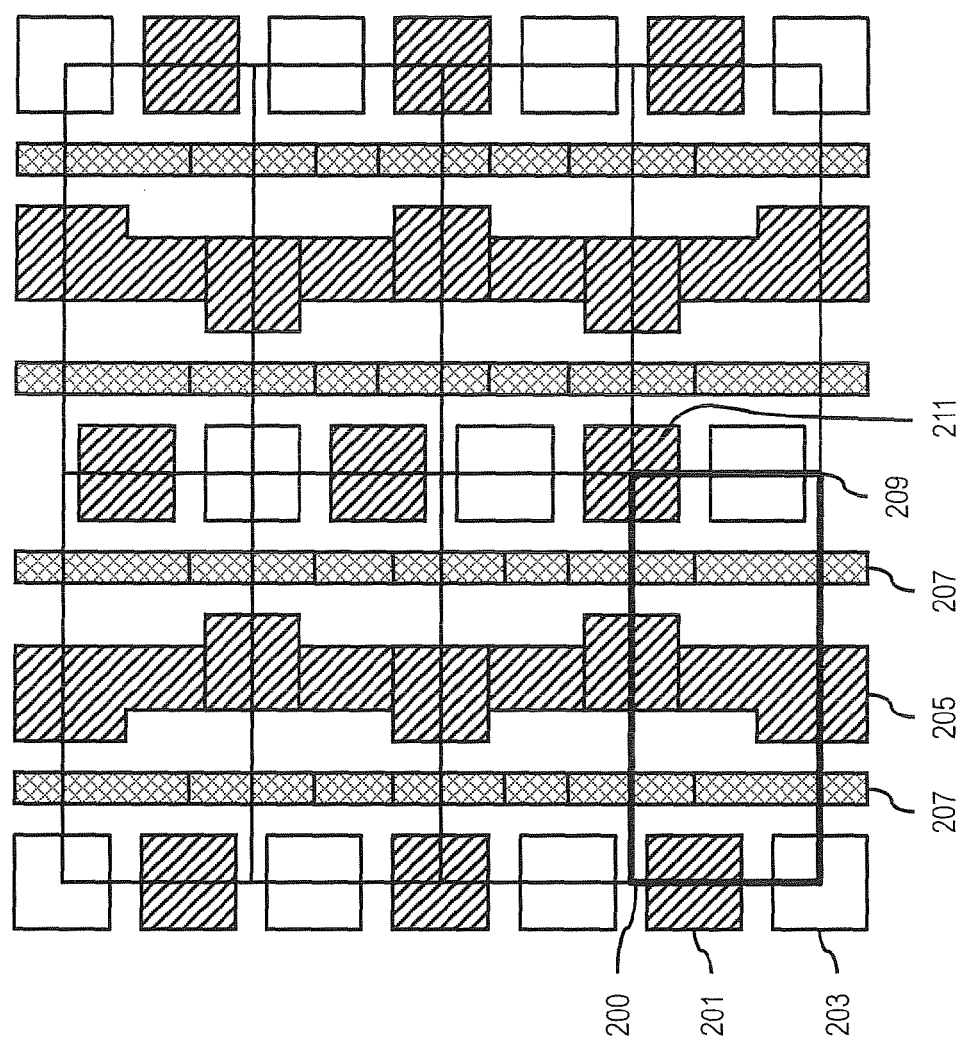
FIG. 2 schematically illustrates a bit cell with triple patterned metal layer structures, in accordance with an exemplary embodiment of the present disclosure.

FIG. 2 schematically illustrates a bit cell with triple patterned metal layer structures, in accordance with an exemplary embodiment of the present disclosure. As depicted, bit cell 200 represents one of the bit cells of a 2×4 array of bit cells. Bit cell 200 includes metal1 word line structures 201 and 209, metal1 ground line structures 203 and 211, metal1 power line structure 205, and metal1 bit line structures 207 (e.g., metal1 landing pads for connecting to word lines, ground lines, power lines, and bit lines, respectively). As shown, the same pattern (or same color) is utilized to print metal1 word line structures 201, metal1 ground line structures 211, and metal1 power line structures 205, while a different pattern (or different color) is utilized to print metal1 bit line structures 207. Further, a third pattern (or different color) is used to print metal1 ground line structures 203 and metal1 word line structures 209. This triple patterning technique applied to these metal1 layer structures decreases the necessary space between the various metal1 layer structures and, thus, may reduce the overall size of devices implemented with bit cell 200, while maintaining the lithographic printability quality of bit cell 200 during fabrication of such devices. Alternatively (not shown for illustrative convenience), metal 1 word line structures 209 may be patterned (colored) with word line structures 201, and ground line structures 211 may be patterned (colored) with ground line structures 203.

In addition, as depicted, metal1 word line structures 201 and 209 and metal1 ground line structures 203 and 211 are substantially square in shape, each having two tip edges and two side edges. As used herein, side edges of a structure are edges longer than tip edges of the structure (e.g., a side edge of a structure may be about 0 to 10% longer than a tip edge of the structure). As illustrated, each metal1 word line structure 201 or 209 has a side edge that oppositely faces a side edge of a metal1 ground line structure 203 or 211, respectively, and each of the metal1 word line structures 201 or 209 and the metal1 ground line structures 203 or 211 has a tip edge that oppositely faces a side edge of a metal1 bitline structure 207. Side edges of the metal1 word line structure 201 and 209 and the metal1 ground line structure 203 and 209 may be for example 7 to 8% longer than tip edges of the metal1 word line structure 201 and 209 and the metal1 ground line structure 203 and 211, respectively.

As a result of the triple patterning, the spacing between particular metal layer structures of different colors may be reduced in both horizontal and vertical directions, whereas double patterning cannot reduce space in the vertical direction. For example, the tip-to-side space between a metal1 word line structure 201 or 209 and a metal1 bit line structure 207, and the tip-to-side space between a metal1 ground line structure 203 or 211 and a metal1 bit line structure 207 of bit cell 200 are significantly narrower than their respective space counterparts in a typical bit cell. Moreover, because of the substantially square shape and the arrangement of the components of bit cell 200, the horizontal length of the bit cell can be reduced (whereas rectangular landing pads increase horizontal length). Further, the side-to-side space between a metal1 word line structure 201 and a metal1 ground line structure 203 of bit cell 200 are significantly narrower than the tip-to-tip, side-to-tip, or tip-to-side space between a metal1 word line structure and a metal1 ground line structure of a typical bit cell (e.g., since side-to-side space can be more tightly controlled in processing metal layer structures). Oppositely facing side edges of a metal1 word line structure 201 and a metal1 ground line structure 203, for instance, may be 32 nm to 42 nm away from each other. In this way, the size of devices may further be reduced while the quality of lithographic printability of such devices may be maintained.

Figure 3:
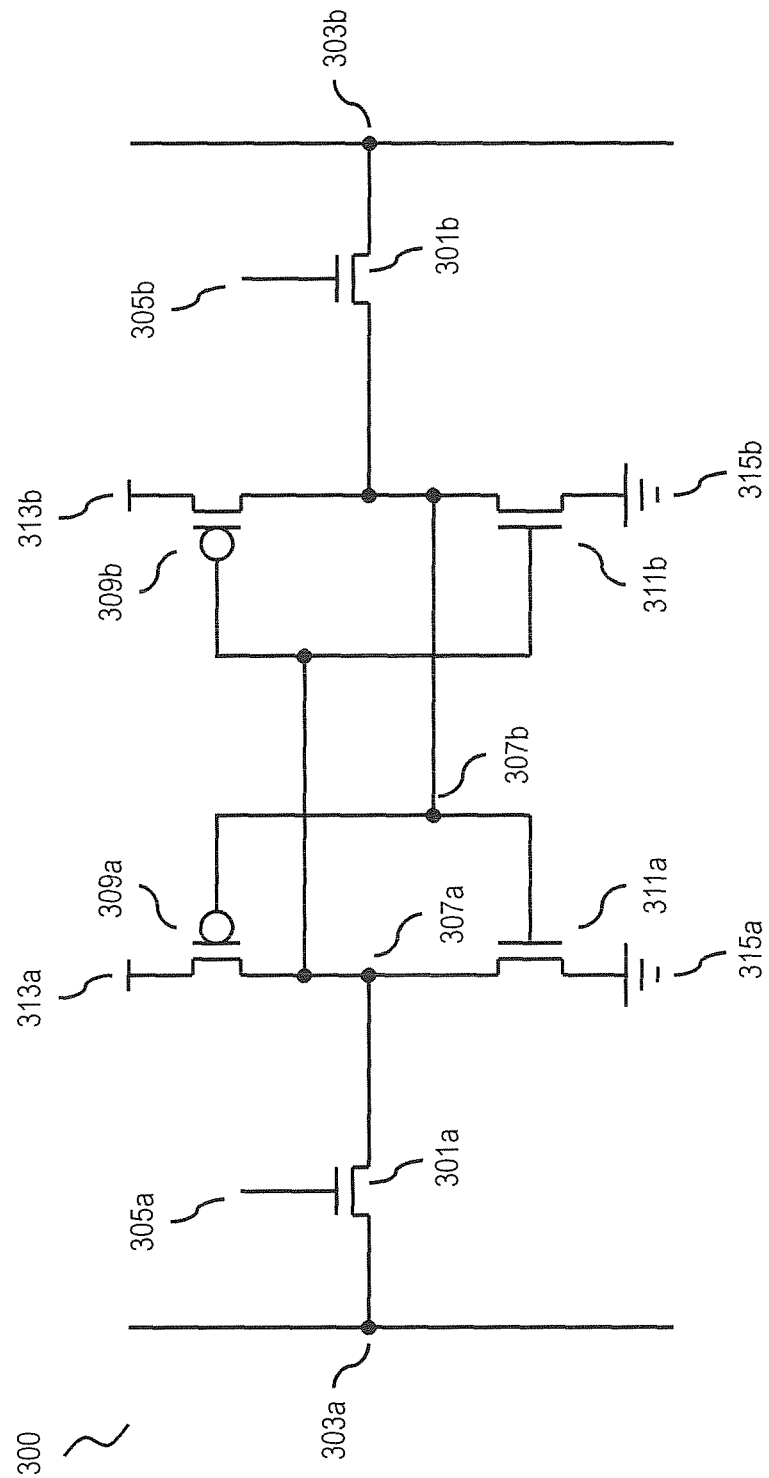
FIG. 3 schematically illustrates a circuit diagram of a bit cell with triple patterned metal layer structures, in accordance with an exemplary embodiment of the present disclosure.

FIG. 3 schematically illustrates a circuit diagram of a bit cell with triple patterned metal layer structures, in accordance with an exemplary embodiment of the present disclosure. As shown, bit cell 300 includes pass-gates 301*a* and 301*b* and inverters. Each pass-gate 301*a*/301*b* is connected to a bit line 303*a*/303*b*, a word line 305*a*/305*b*, and an internal node 307*a*/307*b*. Each inverter includes a PMOS 309*a*/308*b* and a NMOS 311*a*/311*b*, and is connected to a power line 313*a*/313*b* (e.g., via its PMOS 309*a*/309*b*) and a ground line 315*a*/315*b* (e.g., via its NMOS 311*a*/311*b*).

Figure 4:
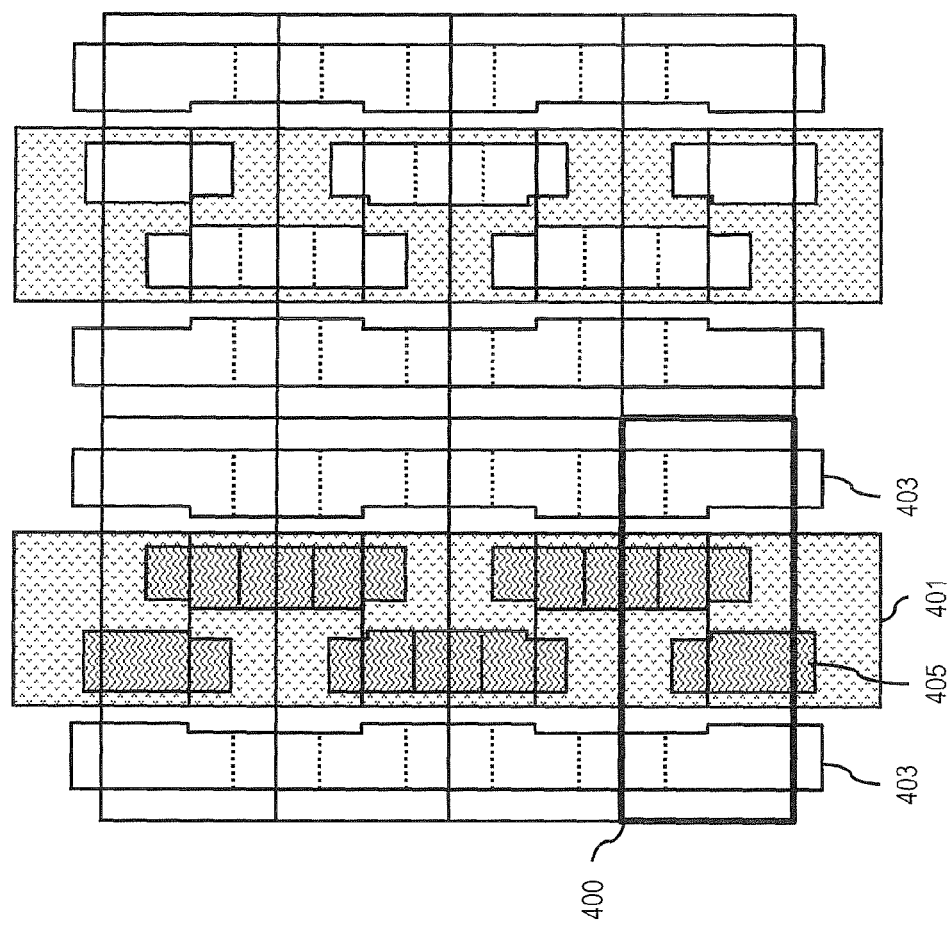
FIG. 4 schematically illustrates n-well region and active regions associated with a bit cell having triple patterned metal layer structures, in accordance with an exemplary embodiment of the present disclosure.

FIG. 4 schematically illustrates n-well regions and active regions associated with a bit cell having triple patterned metal layer structures, in accordance with an exemplary embodiment of the present disclosure. As depicted, as shown, bit cell 400 (e.g., one of the bit cells of a 2×4 array of bit cells) may be formed from base layers that include n-well regions 401, n-active regions 403, and proactive regions 405.

Figure 5:
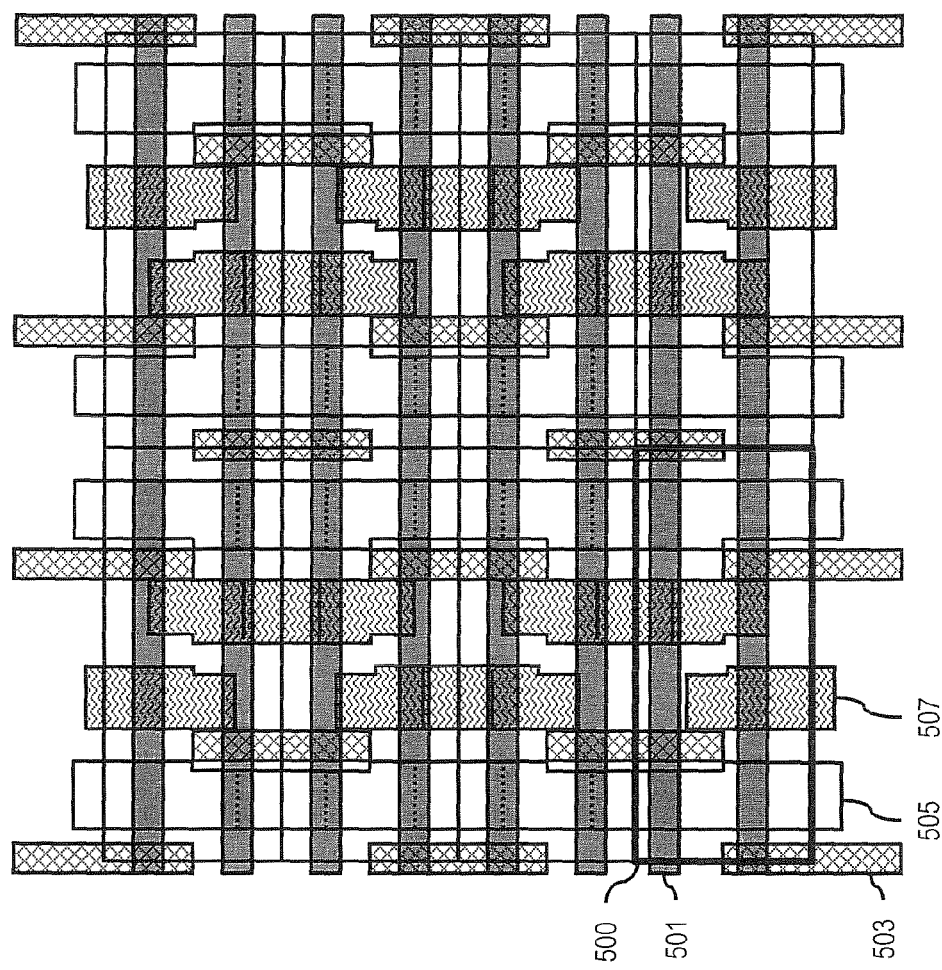
FIG. 5 schematically illustrates poly structures and polycut regions associated with a bit cell having triple patterned metal layer structures, in accordance with an exemplary embodiment of the present disclosure.

FIG. 5 schematically illustrates poly structures and poly-cut regions associated with a bit cell having triple patterned metal layer structures, in accordance with an exemplary embodiment of the present disclosure. As illustrated, bit cell 500 (e.g., one of the bit cells of a 2×4 array of bit cells) may include poly structures 501 for forming transistor gates, and poly-cut regions 503 for cutting poly structures 501. In addition, poly structures 501 may be formed on n-active regions 505 and p-active regions 507.

Figure 6:
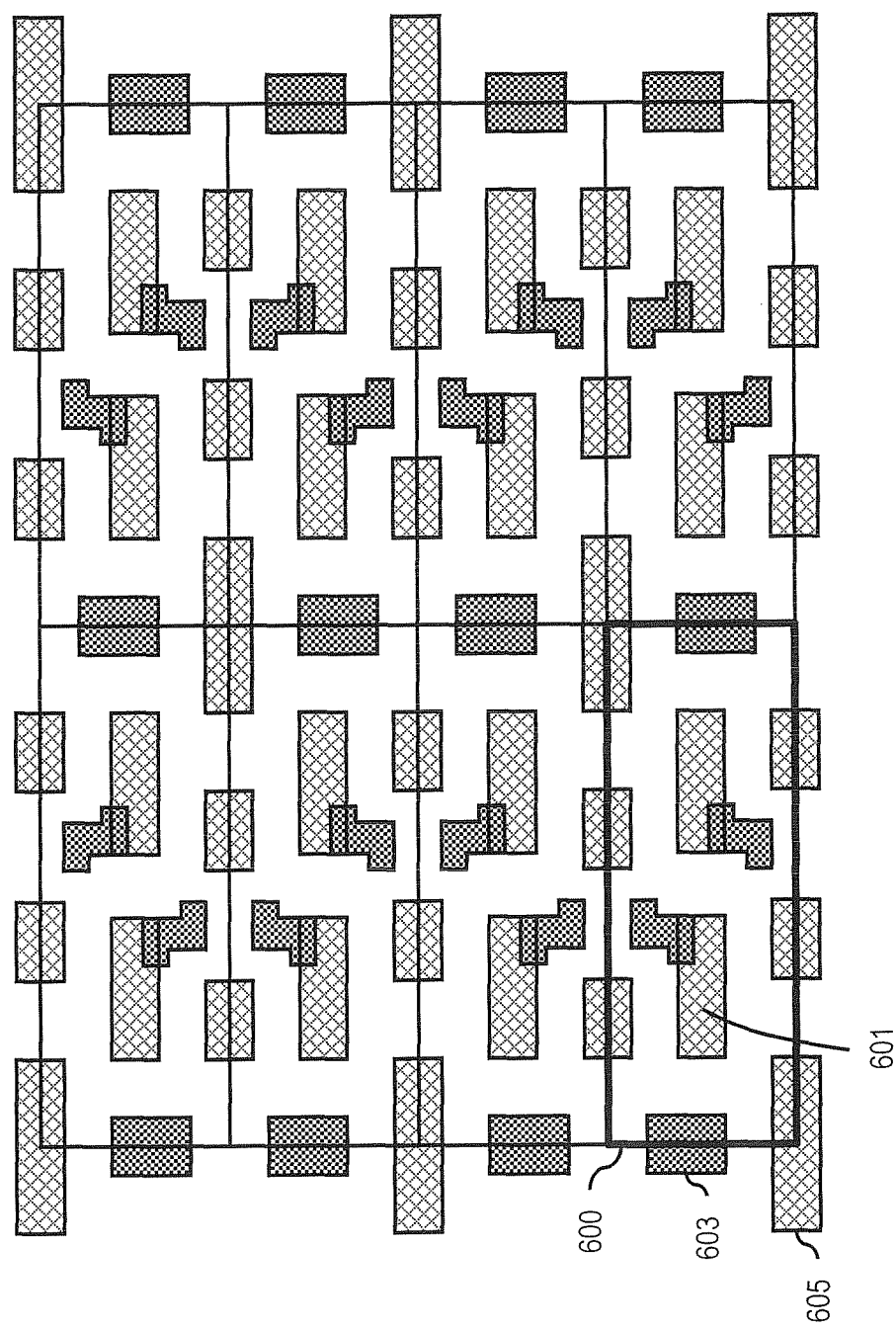
FIG. 6 schematically illustrates active region contacts, gate contacts, and via0 structures associated with a bit cell having triple patterned metal layer structures, in accordance with an exemplary embodiment of the present disclosure.

FIG. 6 schematically illustrates active region contacts, gate contacts, and via0 structures associated with a bit cell having triple patterned metal layer structures, in accordance with an exemplary embodiment of the present disclosure. As depicted, bit cell 600 (e.g., one of the bit cells of a 2×4 array of bit cells) may include active region contacts and gate contacts for local interconnections. For example, active region contact 601 may be used for connecting to n-active regions 505 and p-active regions 507 in FIG. 5, and for connecting to an internal node 307 (e.g., internal node 307*b*) in FIG. 3. Gate contact 603 may be used for connecting to a word line 305 (e.g., word line 305*a*) in FIG. 3. Active region contact 605 may be used for connecting to a ground node 315 (e.g., ground node 315*a*) in FIG. 3.

Figure 7:
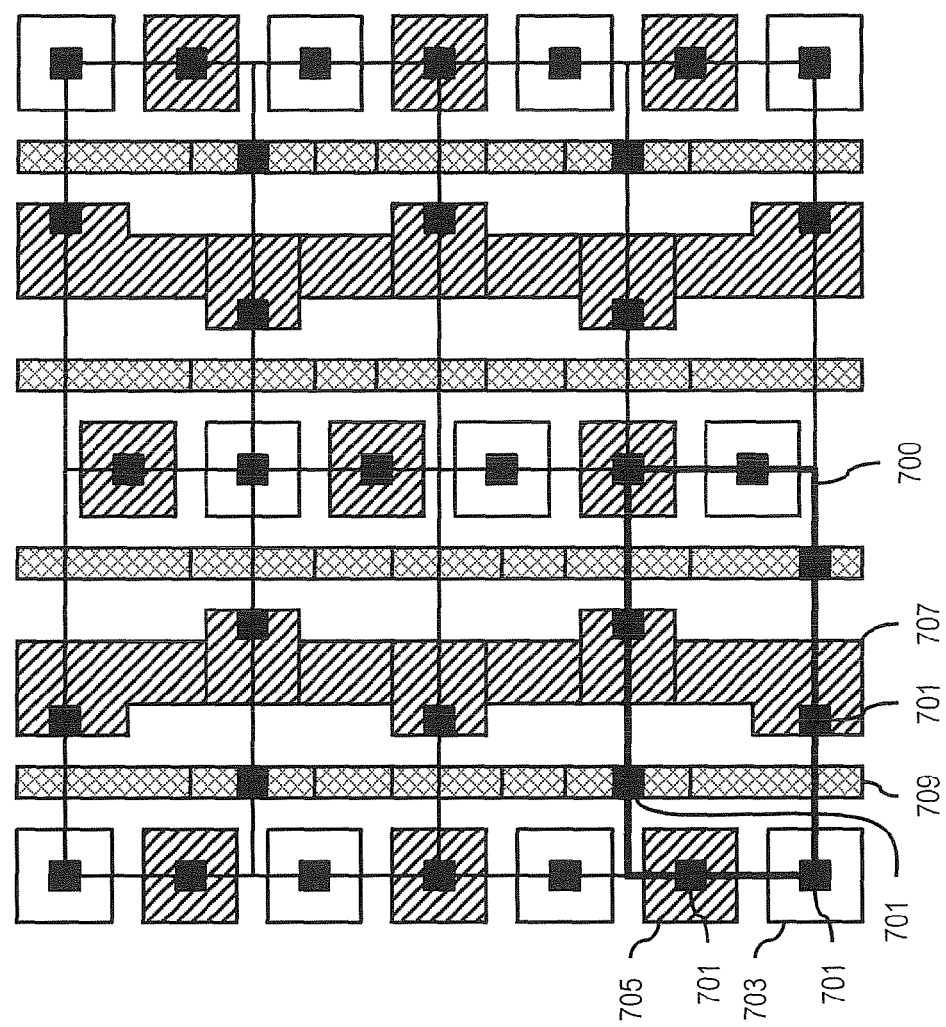
FIG. 7 schematically illustrates via0 structures and metal1 layer structures associated with a bit cell triple patterned metal layer structures, in accordance with an exemplary embodiment of the present disclosure.

FIG. 7 schematically illustrates via0 structures and metal1 layer structures associated with a bit cell having triple patterned metal layer structures, in accordance with an exemplary embodiment of the present disclosure. Bit cell 700 (e.g., one of the bit cells of a 2×4 array of bit cells) may include via0 structures 701 for connecting metal layer structures to active region contacts (e.g., one of the metal1 ground line structures 703 to active region contact 605 of FIG. 6). Metal layer structures of the bit cell 700 may include metal1 ground line structures 703, metal1 word line structures 705, metal1 power line structure 707, and metal1 bit line structures 709, and may be used to connect lower layers to upper layers (not shown for illustrative convenience). For example, metal1 power line structures 707 may be used to connect to upper layers such as via1 (not shown for illustrative convenience) to provide a power supply to various upper layers of bit cell 700.

As indicated, metal1 word line structures 705 and metal1 power line structures 707 may be a first color (or first pattern), metal1 bit line structures 709 may be a second color (or second pattern), and metal 1 ground line structure 703 may be a third color (or). As a result of the triple patterning, space between certain metal layer structures (e.g., metal layer structures that are of different colors) may be effectively reduced without negatively affecting lithographic printability. In addition, as discussed, the metal1 layer structures may be shaped and arranged to further reduce space between metal layer structures. For example, the side-to-side space between a metal1 ground line structure 703 and a metal1 word line structure 705 of bit cell 700 are significantly narrower than the tip-to-tip, side-to-tip, or tip-to-side space between a metal1 word line structure and a metal1 ground line structure of a typical bit cell (e.g., since side-to-side space can be more tightly controlled in processing metal layer structures).

The embodiments of the present disclosure can achieve several technical effects, including reduced bit cell size, improved lithographic printability associated with device fabrication, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in 20 nm technologies nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing, via a first patterning process of a metal layer, a first structure that is a first one of a word line structure, a ground line structure, a power line structure, and a bit line structure;
    providing, via a second patterning process of the metal layer, a second structure that is different than the first structure and that is a second one of the word line structure, the ground line structure, the power line structure, and the bit line structure; and
    providing, via a third patterning process of the metal layer, a third structure that is different than the first structure and the second structure, and that is a third one of the word line structure, the ground line structure line, the power line structure, and the bit line structure.

2. The method according to claim 1, further comprising:
    providing a bit cell having the first structure, the second structure, and the third structure.

3. The method according to claim 2, further comprising:
    providing, via the first patterning process, the word line structure, the power line structure, or a combination thereof of the bit cell;

providing, via the second patterning process, the bit line structure of the bit cell; and providing, via the third patterning process, the ground line structure of the bit cell.

4. The method according to claim 2, further comprising:

providing the bit line structure between the word line structure and the power line structure, between the ground line structure and the power line structure, or a combination thereof.

5. The method according to claim 1, further comprising:

providing the first structure, the second structure, the third structure, or a combination thereof to have first edges and second edges that are 0 to 10 percent longer than the first edges.

6. The method according to claim 5, further comprising:

providing the word line structure, the ground line structure, or a combination thereof to have the first edges and the second edges.

7. The method according to claim 1, further comprising:

providing the bit line structure to be 32 nm to 42 nm away from the power line structure; and providing the word line structure, the ground line structure, or a combination thereof to be 32 nm to 42 nm away from the bit line structure.

8. The method according to claim 1, further comprising:

providing the word line structure to be 32 nm to 42 nm away from the ground line structure.

9. The method according to claim 1, wherein the word line structure, the ground line structure, the power line structure, and the bit line structure are metal1 layer structures.

10. A method comprising:

providing, via a first patterning process of a metal layer, a first structure that is one of a word line structure, a ground line structure, and a power line structure of a bit cell;

providing, via a second patterning process of the metal layer, a bit line structure of the bit cell; and providing, via a third patterning process of the metal layer, a second structure that is different than the first structure and that is one of the word line structure and the ground line structure line.

11. The method according to claim 10, further comprising:

providing the bit line structure between the word line structure and the power line structure, between the ground line structure and the power line structure, or a combination thereof.

12. The method according to claim 10, further comprising:

providing the first structure, the second structure, or a combination thereof to have first edges and second edges adjacent the first edges and that are 0 to 10 percent longer than the first edges.

13. The method according to claim 12, further comprising:

providing the word line structure, the ground line structure, or a combination thereof to have the first edges and the second edges.

14. The method according to claim 10, wherein the word line structure, the ground line structure, the power line structure, and the bit line structure are metal1 layer structures.

* * * * *